(12) United States Patent
Wu

(10) Patent No.: US 8,296,471 B2
(45) Date of Patent: Oct. 23, 2012

(54) KEY ACTIVITY DETECTION SYSTEM AND METHOD THEREOF

(75) Inventor: Sheng-Hung Wu, HsinChu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/015,190

(22) Filed: Jan. 27, 2011

(65) Prior Publication Data

US 2011/0191505 A1    Aug. 4, 2011

(30) Foreign Application Priority Data

Feb. 4, 2010    (TW) .................. 99103394 A

(51) Int. Cl.
*G06F 3/00*    (2006.01)
*G06F 13/00*    (2006.01)

(52) U.S. Cl. ......... 710/14; 710/2; 710/5; 710/8; 710/15; 710/32

(58) Field of Classification Search .................. None
See application file for complete search history.

(56) References Cited

U.S. PATENT DOCUMENTS

| | | | |
|---|---|---|---|
| 3,786,497 A | 1/1974 | Davis et al. | |
| 4,651,133 A | 3/1987 | Ganesan et al. | |
| 5,036,320 A | 7/1991 | Wroblewski | |
| 5,619,196 A | 4/1997 | Escobosa | |
| 5,929,790 A | 7/1999 | Lim | |
| 6,630,927 B2 | 10/2003 | Sherman et al. | |
| 7,119,714 B2 | 10/2006 | Dwelley et al. | |
| 2010/0148995 A1* | 6/2010 | Elias ........................ | 341/22 |

FOREIGN PATENT DOCUMENTS

| | | |
|---|---|---|
| CN | 1952853 A | 4/2007 |
| CN | 101359034 A | 2/2009 |

OTHER PUBLICATIONS

Albus, Zack, PCB-Based Capacitive Touch Sensing with MSP430, Oct. 2007, Texas Instruments, [online, accessed on Dec. 14, 2011], URL: http://www.ti.com/lit/an/slaa363a/slaa363a.pdf.*

* cited by examiner

*Primary Examiner* — Scott Sun
(74) *Attorney, Agent, or Firm* — Rabin & Berdo, P.C.

(57) ABSTRACT

A key activity detection method, applied in an electronic device having at least a first key and a digital I/O pin, includes: switching the digital I/O pin to a first operation mode, so that a voltage of the digital I/O pin is decreased to a ground voltage; switching the digital I/O pin to a second operation mode, so that the voltage of the digital I/O pin is increased; measuring a first charge period of the voltage of the digital I/O pin; counting a first appearance times of the first charge period; judging whether the first key is stably activated according to the first appearance times of the first charge period.

13 Claims, 5 Drawing Sheets

KEY ACTIVITY DETECTION SYSTEM AND METHOD THEREOF

This application claims the benefit of Taiwan application Serial No. 99103394, filed Feb. 4, 2010, the subject matter of which is incorporated herein by reference.

BACKGROUND OF THE DISCLOSURE

1. Technical Field

The disclosure relates in general to a key activity detection system and a method thereof.

2. Background

Currently, there are many ways for detecting whether multiple keys are pressed/released. Let the computer keyboard be taken for example. A computer keyboard has many independent driving lines and sensing lines. Which computer key(s) is/are pressed/released can be identified by sequentially scanning the driving lines. However, this method is applicable to the computer keyboard with large-sized printed circuit board.

Let the human machine interface be taken for example. For example, the DVD drive or the DVD player equipped with push buttons detects whether the button (such as disc ejection button) is pressed, so that the DVD drive or the DVD player performs corresponding mechanical operation (such as to eject the disc). Currently, to detect whether a key/button is pressed/released in a human machine interface system can be implemented by an analog-to-digital converter (ADC). Since the ADC is an analog circuit, once the chip manufacturer or the manufacturing process changes, the adaptation of the ADC needs to be checked again. In some cases, a re-designed new ADC may be needed, which raises a big waste of time and resources. Further, the ADC needs to cooperate with analog pins, which can only support fixed functions and cannot be adapted to fit the needs of design change.

Therefore, it is a prominent task for the industries to provide a key activity detection system which resolves the weakness of the currently available technology.

BRIEF SUMMARY OF THE DISCLOSURE

The disclosure is directed to a key activity detection system and a method thereof. Whether the key(s) is/are stably activated (pressed/released) is judged according to the duration of a charge period, the appearance time(s) of the charge period, and the change of the charge period.

According to a first exemplary embodiment of the present disclosure, a key activity detection method applied in an electronic device is disclosed. The electronic device has at least a first key and a digital I/O pin. The method includes: switching the digital I/O pin to a first operation mode, so that a voltage of the digital I/O pin is decreased to a ground voltage; switching the digital I/O pin to a second operation mode, so that the voltage of the digital I/O pin is increased; measuring a first charge period of the voltage of the digital I/O pin; counting a first appearance time(s) of the first charge period; and judging whether the first key is stably activated according to the first appearance time(s) of the first charge period.

According to a second exemplary embodiment of the present disclosure, a key activity detection system is disclosed. The system includes: at least a first key; a first capacitor coupled to the first key; a digital I/O pin coupled to the first key; and a controller coupled to the digital I/O pin and the first key. During mode switching, a voltage of the digital I/O pin is increased/decreased; and the controller measures a first charge period of the voltage of the digital I/O pin. If a first appearance time(s) of the first charge period exceeds a threshold, the controller determines that the first key is stably activated.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE PRESENT DISCLOSURE

In an embodiment of the disclosure, when a stable key activity is detected, a corresponding operation is performed in response to the stable key activity. To the contrary, if the key activity is detected as a transient state (that is, an unstable key activity), then the key activity is neglected.

Figure 1:
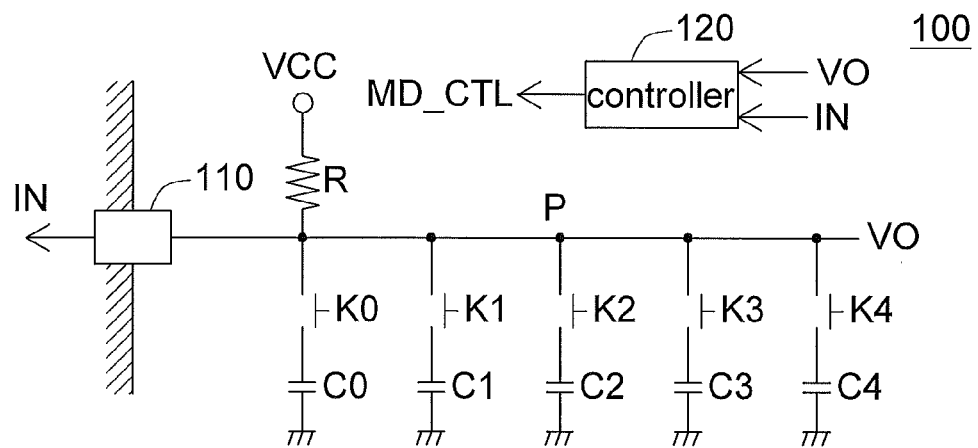
FIG. 1 shows a key activity detection system according to an embodiment of the disclosure.

FIG. 1 shows a key activity detection system according to the embodiment of the disclosure. The key activity detection system 100 is disposed in an electronic device, such as but is not limited to a DVD drive or a DVD player. As indicated in FIG. 1, the key activity detection system 100 includes an input/output (I/O) pin 110, a controller 120, a resistor R, a plurality of keys K0~K4 and a plurality of capacitors C0~C4. The capacitances of capacitors C0~C4 are different and known.

The I/O pin 110 is a digital pin. The I/O pin 110 has two operation modes: the input mode and the output mode. Operation of the I/O pin 110 is switched in response to a mode control signal MD_CTL outputted from the controller 120. In the following disclosure, if the mode control signal MD_CTL is logic high, the I/O pin 110 is in the output mode and set to GND. To the contrary, if the mode control signal MD_CTL is logic low, the I/O pin 110 is in the input mode. However, anyone who is skilled in the technology of the disclosure will understand that the disclosure is not limited thereto. Besides, the logic high period of the mode control signal MD_CTL are long enough for the output voltage VO to be decreased to a ground voltage GND.

In the present embodiment of the disclosure, in case that the I/O pin 110 is in the input mode, if one or multiple corresponding keys is/are already pressed, then electrical conduction is formed between the corresponding one or multiple capacitors and a node point P, and the corresponding capacitor(s) will be charged by an operating voltage VCC. On the other hand, in case that the I/O pin 110 is in the output mode and set to GND, if one or multiple corresponding key is/are already pressed, then the corresponding one or multiple capacitor will be in a discharge state, and the output voltage VO will be decreased. The resistor R is serially connected between the operating voltage VCC and the node point P. The keys K0~K4 are connected between the node point P and the capacitors C0~C4 respectively.

Figure 2:
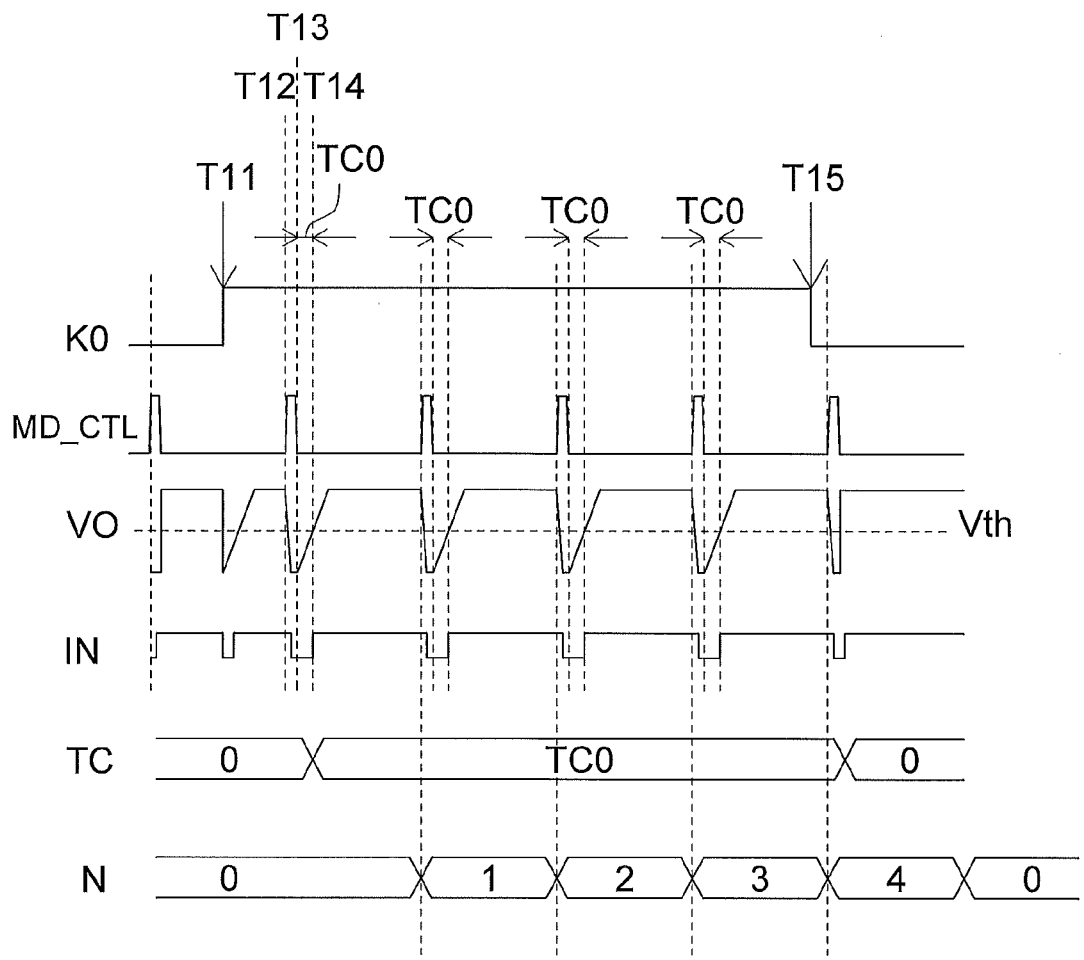
FIG. 2 shows a timing diagram of according to the embodiment of the disclosure.

FIG. 2 shows a timing diagram of according to the embodiment of the disclosure. In FIG. 2, the signal K0 indicates whether the key K0 is pressed. For example, that the signal K0 is logic low implies that the key K0 is in a release state. To the contrary, that the signal K0 is logic high implies that the key K0 is in a press state.

The signal TC indicates the period (also known as "charge period") required for the output voltage VO to be increased to a level higher than the threshold voltage Vth from the ground voltage GND after the I/O pin 110 is switched to the input mode from the output mode. The respective capacitances of the capacitors C0~C4 are different and the resistance of the resistor R is known, so the respective charging rate of the capacitors C0~C4 is also known. When one (or more) key is stably pressed, the charge period for its corresponding capacitor to be charged to a level higher than the threshold voltage Vth from the ground voltage GND is also known. In the present embodiment of the disclosure, a look-up table is built in the controller 120. The look-up table keeps a record of all possible charge periods and all possible key activities corresponding to all possible charge periods. The possible charge periods include but are not limited to the charge period detected when one single key is pressed, possible charge periods detected when a plurality of keys (such as 2 or 3 or more keys) is pressed, and so on. After the controller 120 detects the charge period required for the output voltage VO to be charged to a level higher than the threshold voltage Vth, the controller 120 will perform comparison to identify which capacitor(s) is in the charge state so as to identify which key(s) is pressed. To the contrary, if the measured charge period does not belong to any of the possible combinations and/or the appearance time(s) of the charge period is/are not enough, then the charge period is regarded as being caused by unintentional key pressing by the user and is neglected by the controller 120.

The signal N indicates the repetition times of the charge period TC. For example, assume the key K0 is stably pressed, basically a single charge period TC0 will be detected each time the I/O pin 110 is switched to the input mode from the output mode. By accumulating the appearance time(s) of the detected charge period TC0, the accumulative value N will be obtained. If the duration of the charge period TC changes (for example, due to press of other key, release of the key K0, or unstable key activity), then the accumulative value N will be reset as 0.

The signal IN reflects the output voltage VO. In greater details, when the output voltage VO is lower than the threshold voltage Vth, the signal IN is logic 0. To the contrary, when the output voltage VO is higher than the threshold voltage Vth, the signal IN is logic 1. That is, the signal IN can be regarded as a digital version of the output voltage VO. The signal IN and the output voltage VO are inputted to the controller 120.

Referring to FIG. 2. Suppose the user did not press any key activity before timing T11. At timing T11, the user presses the key K0. Meanwhile, the voltage of the non-ground end of the capacitor C0 is the ground voltage because the capacitor C0 is completely discharged. Therefore, at timing T11, at the moment the user presses the key K0, the output voltage VO will immediately become the ground voltage GND because the voltage of the non-ground end of the capacitor C0 is still the ground voltage. After that, the capacitor C0 is charged and the output voltage VO is increased.

At timing T12, since the I/O pin 110 is switched to the output mode, the output voltage VO is decreased to the ground voltage GND. Then, at timing T13, since the I/O pin 110 is switched back to the input mode and the key K0 is still being pressed, the capacitor C0 is charged and the output voltage VO is increased. At timing T14, the output voltage VO is increased higher than the threshold voltage Vth.

After the I/O pin 110 is switched back to the input mode from the output mode, the charge period required for the output voltage VO to be increased from the ground voltage to a level higher than the threshold voltage Vth is measured. In the following periods, since the key is stably pressed, multiple periods TC0 will be stably nearly detected. The appearance time(s) of the charge period TC0 is/are counted and accumulated, and the change in the accumulative value N is as follows: 0→1→2→3→4.

At timing T15, the key K0 is released, and the signal TC will be set as 0. Likewise, the accumulative value N will be set to 0 as well. If the accumulative value N is larger than or equal to the threshold Nth, then the controller 120 detects a stable key activity (i.e. FIG. 2 shows the key is pressed); and according to the detected charge period, the controller 120 identifies which key or keys is pressed from the look-up table, and the electronic device performs corresponding operation according to the detection result from the controller 120.

Since the duration that the user stably presses the key is not very short (for example, at least around 0.2 seconds), as long as the frequency of the mode control signal MD_CTL is high enough, the accumulative value N will be larger than the threshold within the period that the user stably presses the key.

Figure 3:
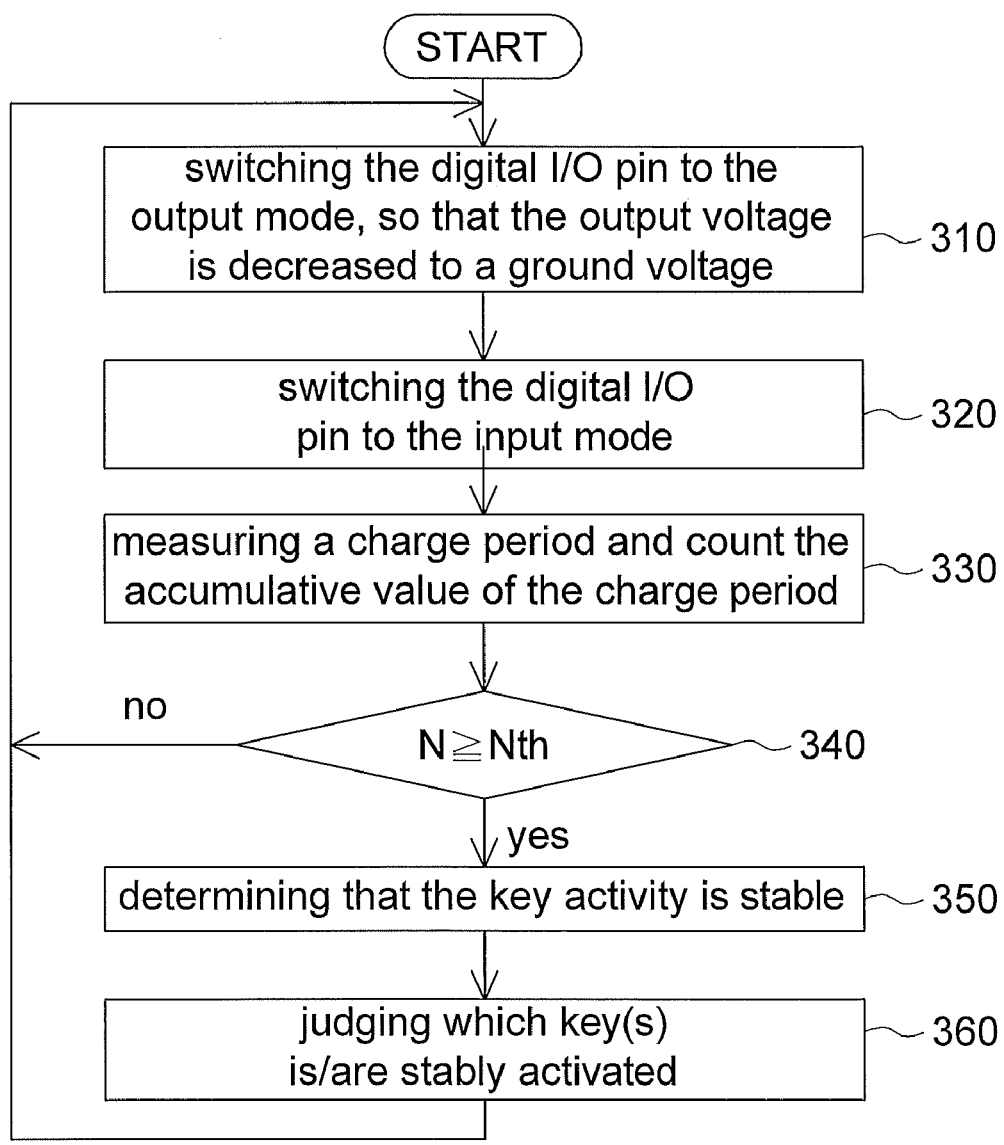
FIG. 3 shows a flowchart of detecting stable key activity according to the embodiment of the disclosure.

FIG. 3 shows a flowchart of detecting stable key activity according to the embodiment of the disclosure. At step 310, the I/O pin 110 is switched to the output mode to discharge the capacitor so that the output voltage VO is decreased to the ground voltage GND.

At step 320, the I/O pin 110 is switched to the input mode. At step 330, after the mode is switched, the charge period is measured, and the appearance time(s) (the accumulative value) of the charge period is/are counted.

After that, at step 340, whether the accumulative value N is larger than or equal to the threshold Nth is judged. If yes, then the method proceeds to step 350, otherwise, the method returns to step 310. In greater details, in step 340, if the accumulative value is smaller than the threshold, then the controller 120 will neglect the detected charge period.

Afterwards, at step 350, the controller 120 determines that a stable key activity is detected. At step 360, the controller 120 will judge which key(s) is/are stably activated. In greater details, in step 360, when the accumulative value N is larger than or equal to threshold Nth, the controller 120 identifies that the measured charge period corresponds to one of all possible key activity combination from the look-up table and further judges which key(s) is/are stably activated. Let FIG. 2 be taken for example. Since the accumulative value N=4 is larger than the threshold (assume that the threshold is as 2 or 3, and can be adjusted if necessary), the controller 120 looks up the table and determines that the charge period TC0 corresponds to the capacitor C0 (that is, the key K0 is pressed). In the present embodiment, the electronic device performs corresponding operation in response to the judgment made by the controller 120. For example, let the key K0 be the disc ejection key. Then, in response to the judgment made by the controller 120, the optical disc drive (the electronic device) will eject the disc.

Despite the FIG. 1 is exemplified by a plurality of keys, the present embodiment of the disclosure can also be applied to the electronic device with only one single key.

Figure 4:
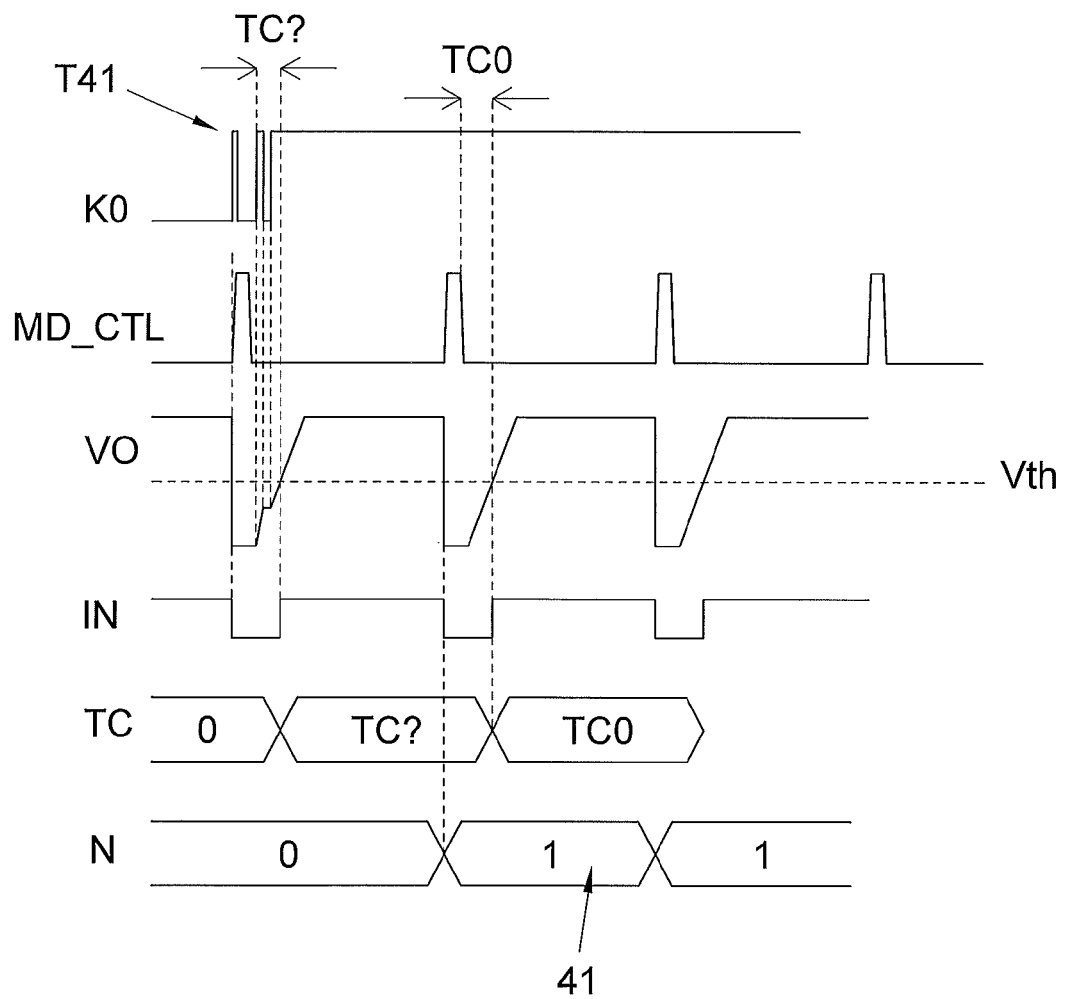
FIG. 4 shows a process of detecting and ignoring unstable key activity according to the embodiment of the disclosure.

How to detect unstable key activity is disclosed below. Referring to FIG. 4, a process of detecting and ignoring unstable key activity according to the embodiment of the disclosure is shown. Suppose the user unstably presses the key K0 at timing T41. Meanwhile, the I/O pin 110 is switched to the input mode from the output mode. Since the capacitor C0 is unstably charged, the charge period is accidentally extended (denoted as "TC?" in FIG. 4). The unstable key activity makes the accumulative value N become 1 (denoted as the designation 41 in FIG. 4). However, since the accumulative value N is smaller than the threshold, the unstable key activity caused by the user at timing 41 will be neglected by the controller. After that, the user stably presses the key K0 as indicated in FIG. 2, and the details are not repeated here.

As indicated in FIG. 4, even during mode switching, the accumulative value will not become larger than or equal to the threshold if the user unstably (unintentionally) presses the key. Thus, the user's unstable key activity will be neglected lest the electronic device might incur erroneous operation. This is because the user may simply press the key unintentionally.

Figure 5:
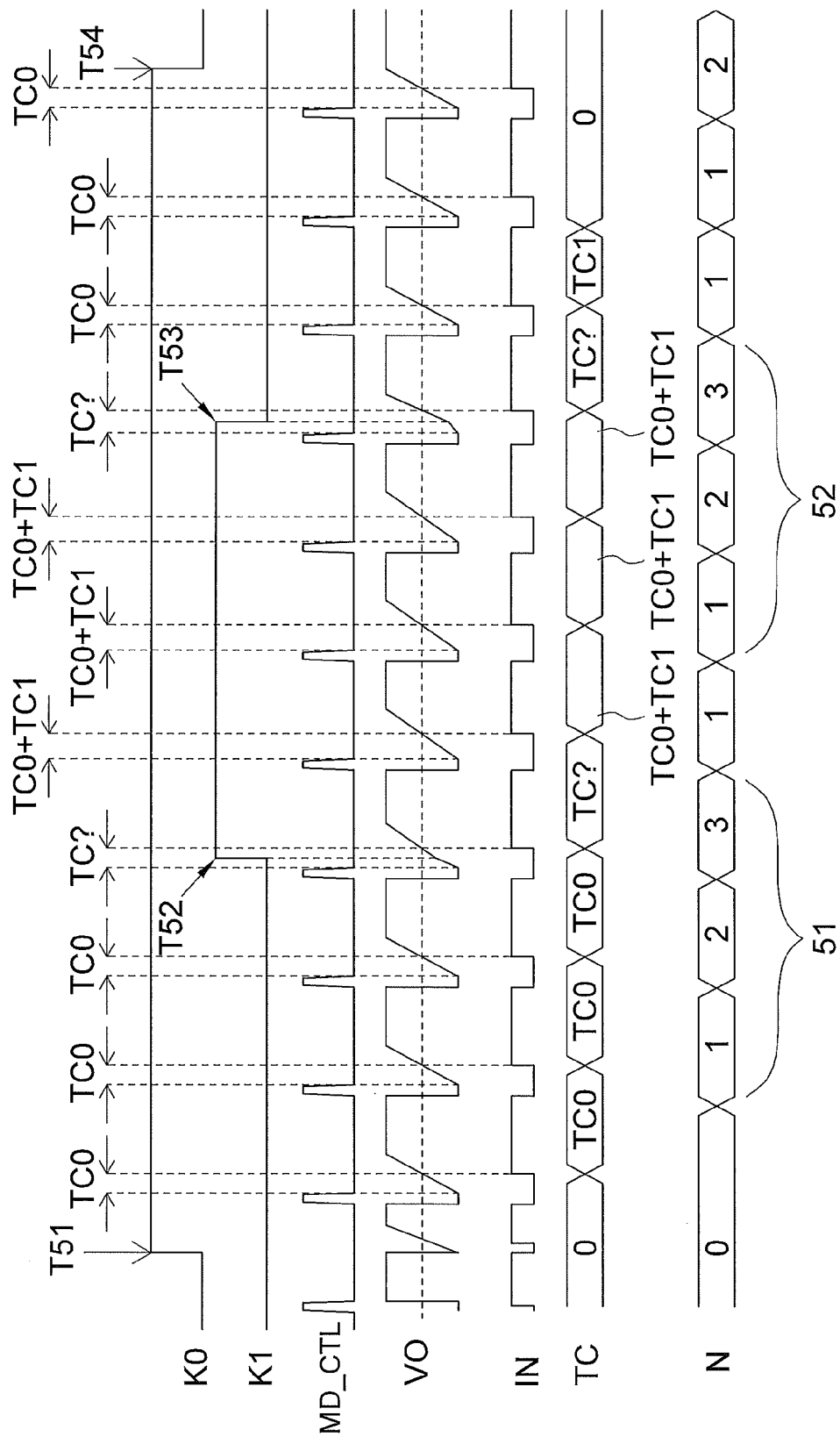
FIG. 5 shows a process of detecting stable multiple-key activity according to the embodiment of the disclosure.

The process of detection when the user unstably presses multiple keys is disclosed below. Referring to FIG. 5, a process of detecting stable multiple-key activity according to the embodiment of the disclosure is shown. As indicated in FIG. 5, suppose no key is pressed before timing T51 and the user stably presses the key K0 at timing T51. The stable key activity will make the controller detect 3 charge period TC0, and make the accumulative value N become larger than or equal to the threshold (as indicated in the designation 51 of FIG. 5, the signal N is accumulated to 3 from 1).

After that, at timing T52, the user stably presses the key K1. Suppose the capacitor C0 is charged at the same time. Since the key K1 is pressed, the capacitor C1 will be charged, and the charge period will change accordingly. Since the charge period at timing T52 is not matched in the in-built look-up table, this is denoted as "TC?" in FIG. 5.

Then, since the user stably presses the keys K0 and K1, the detected charge period will change to a charge period "TC0+TC1" from charge period TC?. The charge period TC0+TC1 is matched in the look-up table. With the keys K0 and K1 being stably pressed, the controller will detect 3 charge periods TC0+TC1, and the accumulative value N becomes larger than or equal to the threshold (as indicated in the designation 52 of FIG. 5, the signal N is accumulated from 1 to 3). Since the accumulative value N is larger than or equal to the threshold, the controller looks up the table, and determines that the charge period TC0+TC1 is a charge period corresponding to the capacitors C0 and C1 and identifies that the user presses the key K0 and K1.

Then, at timing T53, the user releases the key K1. Suppose the capacitor C0 is charged at the same time, and the charge period changes accordingly. Since the charge period corresponding to timing T53 is not matched in the in-built look-up table, the timing is denoted as TC? in FIG. 5.

Since the user still stably presses the key K0, 3 charge periods TC0 will be detected. Next, at timing T54, the user releases the key K1.

As is disclosed above, multiple key activities can be detected in the present embodiment of the disclosure. For example, when the user stably presses multiple keys, the present embodiment of the disclosure can detect and identify which keys are pressed. Likewise, when the user releases a particular key, the present embodiment of the disclosure can detect and identify which key(s) is released by detecting the change of the charge period.

Figure 6:
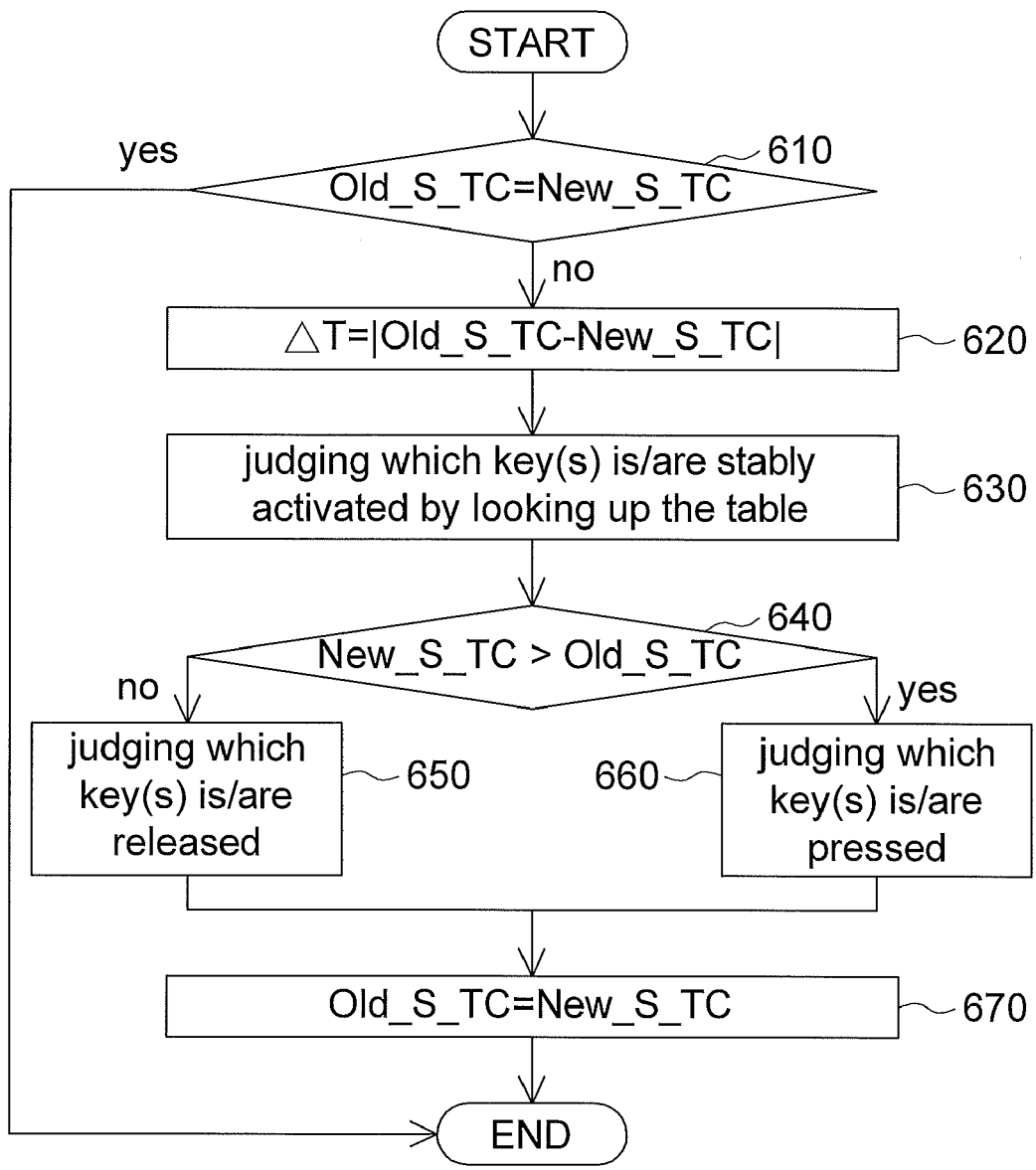
FIG. 6 shows a flowchart of detecting multiple key activities according to the embodiment of the disclosure.

FIG. 6 shows a flowchart of detecting multiple key activities according to the embodiment of the disclosure. As indicated in FIG. 6, in step 610, the controller judges whether the old stable charge period Old_S_TC is equal to the new stable charge period New_S_TC. In greater details, in step 610, the so-called "stable charge period" refers to the charge period whose appearance time(s) is larger than or equal to the threshold. Let FIG. 5 be taken for example, the charge period TC0 which occurs for 3 times (the appearance times are larger than or equal to the threshold) is regarded as the old stable charge period Old_S_TC, and the charge period TC0+TC1 which occurs afterwards (the appearance times, 3, are larger than or equal to the threshold) is regarded as the new stable charge period New_S_TC. If the result of the judgment of step 610 is yes, then the method terminates, otherwise, the method proceeds to step 620.

In step 620, a charge period difference $\Delta T$ between the old stable charge period Old_S_TC and the new stable charge period New_S_TC is calculated. $\Delta T$ can be expressed as: $\Delta T=|Old\_S\_TC-New\_S\_TC|$, that is, $\Delta T$ is the absolute value of the difference between the old stable charge period Old_S_TC and the new stable charge period New_S_TC.

In step 630, the controller judges which key(s) is stably activated by looking up the table according to the charge period difference $\Delta T$. In greater details, the in-built look-up table of the controller further records the correspondences between the charge period difference $\Delta T$ and all possible key activities combinations. For example, let FIG. 5 be taken for example. The difference between the charge period TC0 (the old stable charge period Old_S_TC) and the charge period TC0+TC1 (the new stable charge period New_S_TC) is TC1 ($\Delta T=TC1$), and after looking up the table, the controller still determines that the keys K0 and K1 are activated.

In step 640, the duration of the old stable charge period Old_S_TC and the duration of the new stable charge period New_S_TC are compared. If the new stable charge period New_S_TC is shorter than the old stable charge period Old_S_TC, then the method proceeds to step 650. To the contrary, if the new stable charge period New_S_TC is longer than the old stable charge period Old_S_TC, then the method proceeds to step 660.

In step 650, the controller judges which key(s) is/are released according to the charge period difference $\Delta T$ and the criterion that the new stable charge period New_S_TC is shorter than the old stable charge period Old_S_TC.

In step 660, the controller judges which key(s) is/are released according to the charge period difference $\Delta T$ and the criterion that and the new stable charge period New_S_TC is longer than the old stable charge period Old_S_TC.

Let FIG. 5 be taken for example. Given that the old stable charge period Old_S_TC is the charge period TC0 and the new stable charge period New_S_TC is the charge period TC0+TC1, the controller will determine that the key K1 is pressed, wherein the controller already determines in advance that the key K0 is pressed. After that, given that the old stable charge period Old_S_TC is the charge period TC0+TC1 and the new stable charge period New_S_TC is the charge period TC0, the controller will determine that the key K1 is released and that the key K0 is still pressed. As for the charge period TC? between the stable charge period TC0 and the stable charge period TC0+TC1, the appearance time (1) thereof is lower than the threshold, as indicated in FIG. 3, the charge period TC? will not be regarded as a stable charge period, and the controller will not perform any corresponding operations.

In step 670, the new stable charge period New_S_TC is set as the old stable charge period Old_S_TC (Old_S_TC=New_S_TC).

Despite the above embodiment is exemplified by the key(s), anyone who is skilled in the technology of the disclosure will understand that other embodiments of the disclosure are applicable to the electronic device equipped with push buttons or switches.

The key activity detection system and method disclosed in the above embodiments of the disclosure have technical features exemplified below: (1) Operation mode of the I/O pin is alternately switched between the input mode and the output mode instead of being fixed in the input mode. (2) The I/O pin is alternately switched between the input mode and the output mode, so that the output voltage is alternately increased and decreased instead of being fixed at a sable voltage. (3) Unlike the conventional ADC which samples according to multiple levels, the disclosure performs sampling by the binary method. (4) Unlike the conventional ADC which judges whether a key is activated according to voltage change, the disclosure judges whether the key is stably activated (pressed/released) according to the duration of a charge period, the appearance time(s) of the charge period, and the change of the charge period (that is, the difference and the relationship between the old stable charge period and the new stable charge period).

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A key activity detection method applied in an electronic device having at least a first key and a digital input/output (I/O) pin, comprising:
   switching the digital I/O pin to a first operation mode, so that a voltage of the digital I/O pin is decreased to a ground voltage;
   switching the digital I/O pin to a second operation mode, so that the voltage of the digital I/O pin is increased;
   measuring a first charge period of the voltage of the digital I/O pin;
   a first counting step of counting a first number of times the first charge period occurs; and
   judging whether the first key is stably activated according to the first counted number.

2. The method according to claim 1, wherein, during the first charge period, the voltage of the digital I/O pin is increased to a level exceeding a voltage threshold from the ground voltage.

3. The method according to claim 1, wherein, the first counting step comprises:
   accumulating the counted first number if a duration of the first charge period does not change; and
   resetting the counted first number if the duration of the first charge period changes.

4. The method according to claim 1, further comprising:
   judging that the first key is stably activated if the counted first number is larger than or equal to a count threshold.

5. The method according to claim 1, wherein, the electronic device further comprises a second key.

6. The method according to claim 5, further comprising:
   judging the first key or the second key is stably activated according to a duration of the first charge period if the counted first number is larger than or equal to a count threshold.

7. The method according to claim 5, further comprising:
   counting a difference between the first charge period and the second charge period if the first charge period is not equal to a second charge period, wherein, the counted first number of times and a counted second number of times the second charge period occurs are both larger than or equal to the count threshold;
   judging the first key and/or the second key is stably activated according to the difference between the first charge period and the second charge period;
   judging the first key and/or the second key is released if the first charge period is longer than the second charge period; and
   judging the first key and/or the second key is pressed if the first charge period is shorter than the second charge period.

8. A key activity detection system, comprising:
   at least a first key;
   a first capacitor coupled to the first key;
   a digital I/O pin coupled to the first key; and
   a controller coupled to the digital I/O pin and the first key;
   wherein during mode switching, a voltage of the digital I/O pin is increased/decreased, the controller measures a first charge period of the voltage of the digital I/O pin, and determines that the first key is stably activated if a first number of times the first charge period occurs exceeds a count threshold.

9. The key activity detection system according to claim 8, wherein,
   under the control of the controller, the digital I/O pin is switched to a first operation mode, so that the voltage of the digital I/O pin is decreased to a ground voltage;
   under the control of the controller, the digital I/O pin is switched to a second operation mode;
   the controller measures that the voltage of the digital I/O pin is increased to a level exceeding a voltage threshold from the ground voltage during the first charge period;
   the controller counts the first number.

10. The key activity detection system according to claim 9, wherein,
    the controller accumulates the counted first number if a duration of the first charge period does not change; and
    the controller resets the counted first number if the duration of the first charge period changes.

11. The key activity detection system according to claim 10, wherein the electronic device further comprises a second key.

12. The key activity detection system according to claim 11, wherein the controller judges the first key or the second key is stably activated according to a duration of the first charge period if the counted first number is larger than or equal to a count threshold.

13. The key activity detection system according to claim 11, wherein,
    if the first charge period is not equal to a second charge period, the controller calculates a difference between the first charge period and the second charge period wherein the first number, and a second appearance times of number of times the second charge period occurs are both larger than or equal to the count threshold;

the controller judges the first key and/or the second key is stably activated according to the difference between the first charge period and the second charge period;

the controller determines that the first key and/or the second key is released if the first charge period is longer than the second charge period; and the controller determines that the first key and/or the second key is pressed if the first charge period is shorter than the second charge period.

* * * * *